(12) United States Patent
Mizuno

(10) Patent No.: US 7,977,412 B2
(45) Date of Patent: Jul. 12, 2011

(54) EPOXY RESIN COMPOSITION AND SEMICONDUCTOR DEVICE

(75) Inventor: Yasuhiro Mizuno, Utsunomiya (JP)

(73) Assignee: Sumitomo Bakelite Company, Ltd., Tokyo (JP)

( * ) Notice: Subject to any disclaimer, the term of this patent is extended or adjusted under 35 U.S.C. 154(b) by 0 days.

(21) Appl. No.: 12/566,732

(22) Filed: Sep. 25, 2009

(65) Prior Publication Data

US 2010/0016497 A1  Jan. 21, 2010

Related U.S. Application Data

(62) Division of application No. 11/376,363, filed on Mar. 15, 2006, now Pat. No. 7,629,398.

(30) Foreign Application Priority Data

Mar. 16, 2005 (JP) .................................. 2005-075843

(51) Int. Cl.
*C08K 3/36* (2006.01)
*C08K 5/13* (2006.01)
*C08L 63/00* (2006.01)
*H01L 23/29* (2006.01)

(52) U.S. Cl. ........ 523/456; 257/791; 523/453; 523/467; 523/468; 525/109

(58) Field of Classification Search .................. None
See application file for complete search history.

(56) References Cited

U.S. PATENT DOCUMENTS

| 6,242,110 B1 | 6/2001 | Iwasaki et al. |
| 7,354,978 B2 | 4/2008 | Nishitani |
| 2004/0214003 A1 | 10/2004 | Umeno |

FOREIGN PATENT DOCUMENTS

| JP | 1-75556 A | | 3/1989 |
| JP | 09-003161 | | 1/1997 |
| JP | 09-235353 | | 9/1997 |
| JP | 63-286420 | | 11/1998 |
| JP | 11-140274 A | * | 5/1999 |
| JP | 11-140277 | | 5/1999 |
| JP | 2000-44774 | | 2/2000 |
| JP | 2000-44774 A | * | 2/2000 |
| JP | 2001-310930 | | 11/2001 |
| JP | 2002-080695 | | 3/2002 |
| JP | 2002-097344 | | 4/2002 |
| JP | 2004-300327 A | * | 10/2004 |
| JP | 2004-300327 A | | 10/2004 |

* cited by examiner

*Primary Examiner* — Robert Sellers
(74) *Attorney, Agent, or Firm* — Smith, Gambrell & Russell, LLP

(57) ABSTRACT

An epoxy resin composition for encapsulating semiconductors which comprises as essential components (A) an epoxy resin, (B) a phenol resin, (C) a curing accelerator, (D) an inorganic filler and (E) a component comprising (e1) a butadiene-acrylonitrile copolymer having carboxyl group and/or (e2) a reaction product of (e1) a butadiene-acrylonitrile copolymer having carboxyl group with an epoxy resin, wherein the content of component (e1) in the entire epoxy resin composition is 0.01 to 1% by weight. The composition exhibits excellent releasing property in molding, continuous molding property and resistance to solder reflow.

10 Claims, No Drawings

EPOXY RESIN COMPOSITION AND SEMICONDUCTOR DEVICE

CROSS REFERENCE TO RELATED APPLICATIONS

This patent application is a divisional application based on and claiming priority on U.S. patent application Ser. No. 11/376,363 filed on Mar. 15, 2006, U.S. Pat. No. 7,629,398 the contents of which are relied on and incorporated by reference herein.

TECHNICAL FIELD

The present invention relates to an epoxy resin composition and a semiconductor device using the composition. More particularly, the present invention relates to an epoxy resin composition exhibiting excellent fluidity, releasing property from a mold and continuous molding property and to a semiconductor device using the composition and exhibiting excellent resistance to solder reflow.

BACKGROUND ART

As electronic instruments are recently becoming smaller and lighter and exhibiting more excellent performances in the market, the degree of integration in semiconductors increases, and the surface mounting in semiconductor packages is promoted. Moreover, it is considered to be important for activities of corporations that the influences on the global environment are considered, and it is required that the use of lead which is a harmful substance be entirely prohibited by 2006 except specific applications. However, since the melting point of lead-free solder is higher than conventional lead/tin solder, the temperature during the mounting with solder reflow such as infrared solder reflow and dipping into a solder will be elevated to a temperature as high as 240 to 260° C. from 220 to 240° C. in the conventional soldering. Due to the elevation of the temperature during the mounting, a problem arises in that cracks tend to be formed in the resin portion during the mounting, and assurance of reliability becomes difficult. Moreover, with respect to a lead frame, application of a lead frame treated by the nickel palladium plating in advance in place of the exterior solder plating is promoted from the standpoint of the necessity of removing lead from the exterior solder plating. Since the nickel palladium plating has poor adhesion with conventional materials for encapsulating, cleavage tends to take place at the interface during the mounting, and cracks tend to be formed in the resin portion.

The above problems due to the elevation of the temperature during the mounting have been overcome by application of epoxy resins and curing agents exhibiting small absorption of water to improve the heat resistance in soldering (for example, Patent References 1, 2 and 3). However, the epoxy resin composition exhibiting small water absorption and small modulus such as those described above has a small crosslinking density, and the molded article is soft immediately after curing. This causes a problem in the molding property in that the resin adheres to a mold in the continuous production, and the productivity decreases.

As the effort to improve the productivity, application of a mold release exhibiting an excellent releasing effect is proposed (for example, Patent Reference 4). However, a problem arises in this case in that the mold release exhibiting an excellent releasing effect inevitably tends to bloom out on the surface of the molded article, and the appearance of the molded articles is markedly deteriorated during the continuous production. It is proposed that a silicon compounds having a specific structure is added as a means to obtain an epoxy resin composition providing molded articles exhibiting excellent appearance (for example, Patent References 5 and 6). However, this technology causes a problem in that filling of the resin composition is insufficient, and the productivity is decreased since the releasing property from a mold is insufficient, and air vents are clogged due to attachment of the resin to the air vents. As described above, an epoxy resin composition for encapsulating semiconductor devices which can overcome the drawbacks on the heat resistance in soldering, the releasing property from a mold, the continuous molding property, the appearance of the molded article and the fouling on the mold, has been required.

[Patent Reference 1] Japanese Patent Application Laid-Open No. Heisei 9 (1997)-3161 (pages 2 to 5)

[Patent Reference 2] Japanese Patent Application Laid-Open No. Heisei 9 (1997)-235353 (pages 2 to 7)

[Patent Reference 3] Japanese Patent Application Laid-Open No. Heisei 11 (1999)-140277 (pages 2 to 11)

[Patent Reference 4] Japanese Patent Application Laid-Open No. 2002-80695 (pages 2 to 5)

[Patent Reference 5] Japanese Patent Application Laid-Open No. 2002-97344 (pages 2 to 10)

[Patent Reference 6] Japanese Patent Application Laid-Open No. 2001-310930 (pages 2 to 8)

DISCLOSURE OF THE INVENTION

The present invention has been made to overcome the above problems and has an object of providing an epoxy resin composition exhibiting excellent fluidity, releasing property from a mold and continuous molding property and a semiconductor device using the epoxy resin composition and exhibiting excellent resistance to solder reflow.

The present invention provides:

[1] An epoxy resin composition for encapsulating semiconductors which comprises as essential components (A) an epoxy resin, (B) a phenol resin, (C) a curing accelerator, (D) an inorganic filler and (E) a component comprising at least one of (e1) a butadiene-acrylonitrile copolymer having carboxyl group and (e2) a reaction product of (e1) a butadiene-acrylonitrile copolymer having carboxyl group with an epoxy resin, wherein a content of component (e1) in the entire epoxy resin composition is 0.01% by weight or greater and 1% by weight or smaller;

[2] The epoxy resin composition for encapsulating semiconductors described in [1], wherein the epoxy resin (A) comprises at least one epoxy resin selected from the group consisting of (a1) a biphenyl type epoxy resin and (a2) a phenol aralkyl type epoxy resin having a skeleton structure of biphenylene and the phenol resin (B) comprises at least one phenol resin selected from the group consisting of (b1) a phenol aralkyl type resin having a skeleton structure of phenylene and (b2) a phenol aralkyl type resin having a skeleton structure of biphenylene;

[3] The epoxy resin composition for encapsulating semiconductors described in [1], wherein the epoxy resin (A) comprises (a1) a biphenyl type epoxy resin and the phenol resin (B) comprises (b1) a phenol aralkyl type resin having a skeleton structure of phenylene;

[4] The epoxy resin composition for encapsulating semiconductors described in [1], wherein the epoxy resin (A) comprises (a phenol aralkyl type epoxy resin having a skeleton structure of biphenylene and the phenol resin (B) comprises (b2) a phenol aralkyl type resin having a skeleton structure of biphenylene;

[5] The epoxy resin composition for encapsulating semiconductors described in any one of [1] to [4], wherein content of sodium ion in the component (e1) is 10 ppm or less and content of chlorine ion in the component (e1) is 450 ppm or less;

[6] The epoxy resin composition for encapsulating semiconductors described in any one of [1] to [5], wherein the butadiene-acrylonitrile copolymer having carboxyl group (e1) is a compound represented by a general formula (1):

$$HOOC[(Bu)_x(ACN)_y]_zCOOH \qquad (1)$$

wherein Bu represents a butadiene unit, ACN represents an acrylonitrile unit, Bu and ACN may be arranged randomly or in blocks, x and y each represents a positive number less than 1, x+y=1, and z represents an integer of 50 to 80;

[7] An epoxy resin composition for encapsulating semiconductors described in any one of [1] to [6], wherein the butadiene-acrylonitrile copolymer having carboxyl group (e1) comprises an antioxidant;

[8] The epoxy resin composition for encapsulating semiconductors described in [7], wherein the antioxidant is a non-phosphor type antioxidant;

[9] The epoxy resin composition for encapsulating semiconductors described in [8], wherein the antioxidant is a phenol type antioxidant;

[10] The epoxy resin composition for encapsulating semiconductors described in any one of [1] to [9], which comprises (F) a component comprising at least one of (f1) an organopolysiloxane having carboxyl group and (f2) a reaction product of (f1) an organopolysiloxane having carboxyl group with an epoxy resin, wherein a content of component (f1) in the entire epoxy resin composition is 0.01% by weight or greater and 3% by weight or smaller;

[11] The epoxy resin composition for encapsulating semiconductors described in [10], wherein the organopolysiloxane having carboxyl group is an organopolysiloxane represented by following general formula (2):

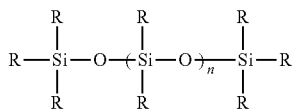

wherein at least one R among a plurality of R represents a hydrocarbon group having 1 to 40 carbon atoms and carboxyl group and rest of R each represent hydrogen atom or a group selected from phenyl group and methyl group, the atoms and the groups represented by a plurality of R may be a same with or different from each other, and n represents an average value, which is a positive number of 1 to 50; and

[12] A semiconductor device which comprises semiconductor elements encapsulating by using the epoxy resin composition described in any one of [1] to [11].

THE MOST PREFERRED EMBODIMENT TO CARRY OUT THE INVENTION

In accordance with the present invention, an epoxy resin composition for encapsulating semiconductor devices which exhibits excellent releasing property from a mold and continuous molding property, small stress and excellent resistance to solder reflow can be obtained since the epoxy resin composition for encapsulating semiconductors comprises as the essential components (A) an epoxy resin, (B) a phenol resin, (C) a curing accelerator, (D) an inorganic filler and (E) a component comprising (e1) a butadiene-acrylonitrile copolymer having carboxyl group and/or (e2) a reaction product of (e1) a butadiene-acrylonitrile copolymer having carboxyl group with an epoxy resin.

The present invention will be described specifically in the following.

As the epoxy resin of component (A) used in the present invention, monomers, oligomers and polymers having two or more epoxy groups in one molecule in general can be used. Examples of the epoxy resin include epoxy resins of the phenol novolak type, epoxy resins of the cresol novolak type, epoxy resins of the biphenyl type, epoxy resins of the bisphenol type, epoxy resins of the stilbene type, epoxy resins of the triphenolmethane type, epoxy resins of the phenol aralkyl type, epoxy resins of the naphthol type, epoxy resins of the alkyl-modified triphenolmethane type, epoxy resins having a triazine nucleus and epoxy resins of the dicyclopentadiene-modified phenol type. However, the epoxy resin is not limited to the resins described above. The epoxy resin may be used singly or in combination of two or more. When the resistance to soldering is required, it is preferable that an epoxy resin of the biphenyl type, an epoxy resin of the bisphenol type or an epoxy resins of the stilbene type which is a crystalline solid at the ordinary temperature and a liquid having a very small viscosity at temperatures exceeding the melting point and allows mixing with inorganic fillers in great amounts is used among the above epoxy resins. Even when other epoxy resins are used, epoxy resins having a very small viscosity are preferable. When flexibility and a small moisture absorption are required, it is preferable that an epoxy resin of the phenol aralkyl type having the skeleton structure of phenylene or biphenylene is used. However, the use of the epoxy resin having flexibility and a small viscosity causes a problem in that the releasing property from a mold decreases due to a decrease in the crosslinking density although inorganic fillers can be used in a great amount. The releasing property from a mold can be improved by using Component (E) described later.

As the phenol resin (B) used in the present invention, monomers, oligomers and polymers having two or more phenolic hydroxyl groups in one molecule in general can be used. Examples of the phenol resin include phenol novolak resins, cresol novolak resins, triphenolmethane resins, phenol resins modified with terpene, phenol resins modified with dicyclopentadiene, phenol aralkyl resins having a skeleton structure of phenylene or biphenylene and naphthol aralkyl resins having a skeleton structure of phenylene or biphenylene. However, the phenol resin is not limited to the resins described above. The phenol resin may be used singly or in combination of two or more. When the resistance to soldering is required, it is preferable that a phenol aralkyl resin having a skeleton structure of phenylene or biphenylene is used among the above phenol resins so that inorganic fillers can be added in a great amount into a resin having flexibility and a small viscosity, and a small moisture absorption can be provided to the resin, similarly to the epoxy resin. However, the use of the phenol resin having flexibility and a small viscosity causes a problem in that the releasing property from a mold decreases as the crosslinking density decreases. The releasing property from a mold can be improved by using a mold release described later.

The ratio of the amount by equivalent of the epoxy group in the entire epoxy resin to the amount by equivalent of the hydroxyl group in the entire phenol group used in the present invention is preferably 0.5 or greater and 2 or smaller and more preferably 0.7 or greater and 1.5 or smaller. The decreases in the moisture resistance and the curing property can be suppressed when the ratio is within the above range.

The curing accelerator (C) used in the present invention is an agent which works as the catalyst for the curing reaction between the epoxy group in the epoxy resin and the hydroxyl group in the phenol resin. Examples of the curing accelerator include amine-based compounds such as tributylamine and 1,8-diazabicyclo(5.4.0)undecene; organic phosphorus compounds such as triphenylphosphine and tetraphenylphosphonium tetraphenylborate salts; and imidazole compounds such as 2-methylimidazole. However, the curing accelerator is not limited to the compounds described above The curing accelerator may by used singly or in combination of two or more.

As the inorganic filler (D) used in the present invention, inorganic fillers conventionally used for epoxy resin compositions for encapsulating semiconductors can be used. However the inorganic filler is not particularly limited. Examples of the inorganic filler include fused silica, crystalline silica, alumina, silicon nitride and aluminum nitride. When the inorganic filler is used in a great amount, in general, fused silica is used. As the fused silica, any of crushed fused silica and spherical fused silica can be used. Spherical silica is preferable so that the amount of the fused silica is increased, and the increase in the melt viscosity of the epoxy resin composition is suppressed. For further increasing the amount of spherical silica, it is preferable that the distribution of the particle size of the spherical silica is adjusted to be broader.

In the present invention, it is essential that the epoxy resin composition comprises component (E) comprising (e1) a butadiene-acrylonitrile copolymer having carboxyl group and/or (e2) a reaction product of (e1) a butadiene-acrylonitrile copolymer having carboxyl group with an epoxy resin in an amount of 0.01% by weight or greater and 1% by weight or smaller in an entire epoxy resin composition. The butadiene-acrylonitrile copolymer having carboxyl group of component (e1) is a copolymer of butadiene and acrylonitrile. When the resin composition comprises component (e1) and component (e2) which is a reaction product of component (e1) with an epoxy resin, not only the excellent crack resistance is obtained but also the releasing property from a mold can be improved.

The butadiene-acrylonitrile copolymer having carboxyl group of component (e1) is not particularly limited. Compounds having carboxyl groups at both ends of the structure are preferable, and compounds represented by general formula (1) are more preferable. Due to the polarity of carboxyl group, dispersion of the butadiene-acrylonitrile copolymer in the epoxy resin comprised in the epoxy resin composition for encapsulating semiconductors as a material is improved, and the increase in the fouling on the surfaces of a mold and a molded article can be suppressed. In general formula (1), x represents a content of butadiene unit in molar fraction and is a positive number less than 1, and y represents a content of acrylonitrile unit in molar fraction and is a positive number less than 1, and z represents an integer of 50 to 80. The resin composition of the present invention may further comprise as component (E) a reaction product (e2) obtained by melting and reacting the entire amount or a portion of (e1) the butadiene-acrylonitrile copolymer having carboxyl group of component (e1) with an epoxy resin and a curing accelerator in advance. As the epoxy resin, monomers, oligomers and polymers having two or more epoxy groups in one molecule in general can be used. The epoxy resin used here is not limited by its molecular weight or molecular structure and the same epoxy resin which is exemplified before to be usable as the epoxy resin (A). As for the curing accelerator, it is sufficient that the curing accelerator accelerates the curing reaction between carboxyl group in the butadiene-acrylonitrile copolymer having carboxyl group and epoxy group in the epoxy resin, and the same curing accelerator which is exemplified before to be usable as the curing accelerator (C) can be used. It is necessary that the content of component (e1) in the entire epoxy resin composition is 0.01% by weight or greater and 1% by weight or smaller. The content is preferably 0.05% by weight or greater and 0.5% by weight or smaller and more preferably 0.1% or greater and 0.3% by weight or smaller. Problems such as insufficient filling during molding due to a decrease in the fluidity and deformation of a gold wire due to an increased viscosity can be suppressed when the amount is within the above range.

$$HOOC[(Bu)_x(ACN)_y]_zCOOH \quad (1)$$

In the above general formula (1), Bu represents a butadiene unit, ACN represents an acrylonitrile unit, Bu and ACN may be arranged randomly or in blocks, x and y each represents a positive number less than 1, x+y=1, and z represents an integer of 50 to 80.

The content of acrylonitrile unit in molar fraction y of the butadiene-acrylonitrile copolymer having carboxyl group (e1) used in the present invention is preferably 0.05 or more and less than 0.30 and more preferably 0.10 or more and 0.25 or less. The value of y affects the compatibility of the butadiene-acrylonitrile copolymer having carboxyl end group with epoxy resin matrix. When y is in these ranges, it is possible to control the fouling on a mold or deterioration in appearance of articles of cured resin due to phase separation between the butadiene-acrylonitrile copolymer having carboxyl group and the epoxy resin matrix. The possibility of occurrences of drawbacks such as insufficient filling on molding due to lowering of fluidity or deformation of gold wire in semiconductor devices due to increased viscosity can be controlled.

The number average molecular weight of the butadiene-acrylonitrile copolymer having carboxyl group of component (e1) used in the present invention is preferably 2000 or more and less than 5000 and more preferably 3000 or more and 4000 or less. When the number average molecular weight is in these ranges, it is possible to control the possibility of occurrences of drawbacks such as insufficient filling on molding due to lowering of fluidity or deformation of gold wire in semiconductor devices due to increased viscosity can be controlled.

The carboxyl equivalent of the butadiene-acrylonitrile copolymer having carboxyl group (e1) used in the present invention is preferably 1200 or more and less than 3000 and more preferably 1700 or more and 2500 or less. When the carboxyl equivalent is in these ranges, it is possible to control the drawbacks such as the decrease of fluidity or deterioration of mold release property of the resin composition on molding and fouling of molds or molded articles and thus the continuous molding capability advantageously attained.

In the present invention, it is preferable that the content of sodium ion in the carboxyl equivalent of the butadiene-acrylonitrile copolymer having carboxyl group (e1) is 10 ppm or less and the content of chlorine ion in the copolymer (e1) is 450 ppm or less. The content of sodium ion and chlorine ion can be obtained by the following methods. The content of sodium ion is determined by ICP emission spectrometry after the butadiene-acrylonitrile copolymer having carboxyl group (e1) is decomposed and ashed under dry condition and dissolved in an acid. The content of chlorine ion is determined by ion chromatography. When the content of sodium ion or chlorine ion is within the above range, the possibility of deterioration of the reliability in anti-humidity property of semiconductor device due to the corrosion of circuit by sodium ion or chlorine ion.

It is preferable that the butadiene-acrylonitrile copolymer having carboxyl group (e1) comprises an anti oxidant and it is more preferable that the antioxidant is a non-phosphor type antioxidant. The non-phosphor type antioxidants include phenol type antioxidants, amine type antioxidants and thio- ether type antioxidants. Among these, phenol type antioxi- dants are preferable and for example, 2,6-di-tert-butyl-4-me- thylphenol, 2,6-di-tert-butyl-4-ethyl-phenol, 2,2' ethylidenebis(4,6-di-tert-butylphenol), 2,2' ethylidenebis(2, 4-di-tert-butylphenol), 4,6-di-tert-butylphenol or the like can be used, although specifically limited to these. The phosphor type antioxidants are not preferable because these have a tendency to enhance the corrosion of circuit and hence the reliability in anti-humidity property of semiconductor device is deteriorated.

In the present invention, (F) a component comprising (f1) an organo-polysiloxane having carboxyl group and/or (f2) a reaction product of (f1) an organopolysiloxane having car- boxyl group with an epoxy resin may be used. The organop- olysiloxane having carboxyl group of component (f1) which can be used in the present invention is an organopolysiloxane having one or more carboxyl group in one molecule. When component (F) comprising (f1) an organopolysiloxane hav- ing carboxyl group and/or (f2) a reaction product of (f1) an organopolysiloxane having carboxyl group with an epoxy resin is used, the effect of suppressing the fouling on a mold and a molded article and remarkably improving the continu- ous molding property can be obtained without decreasing the fluidity or the releasing property in molding of the resin composition.

The organopolysiloxane having carboxyl group of compo- nent (f1) which can be used in the present invention is not particularly limited. The organopolysiloxane represented y general formula (2) is preferable. In general formula (2), R represents an organic group. Among the entire organic groups represented by R, at least one group is an organic group having carboxyl group and 1 to 40 carbon atoms, and the rest of the groups each represent hydrogen atom or a group selected from phenyl group and methyl group. The atoms and the groups represented by a plurality of R may be the same with or different from each other. The deterioration in the appearance of the molded article due to a decrease in com- patibility with the resin can be prevented when the number of carbon atoms in the organic group having carboxyl group is within the above range. In general formula (2), n represents an average number, which is an integer of 1 to 50. The decrease in the fluidity due to an increase in the viscosity of the oil itself can be suppressed when the value of the number represented by n is within the above range. When the organopolysiloxane represented by general formula (2) is used, the appearance of the molded article can be remarkably improved without a decrease in the fluidity. When the reaction product of com- ponent (f2) obtained by melting and reacting the entire amount or a portion of (f1) the organopolysiloxane having carboxyl group with an epoxy resin and a curing accelerator in advance is used, the fouling on the mold during the con- tinuous molding is suppressed, and the continuous molding property is remarkably improved. As for the curing accelera- tor, it is sufficient that the curing accelerator accelerates the curing reaction between the carboxyl group in the butadiene- acrylonitrile copolymer and epoxy group in the epoxy resin, and the same curing accelerator which is exemplified before to be usable as the curing accelerator (C) can be used. The number of carbon atom in the organic group having carboxyl group in the organopolysiloxane represented by general formula (2) is the total of the number of carbon atoms in the hydrocarbon groups and the number of carbon atom in carboxyl group in the organic group.

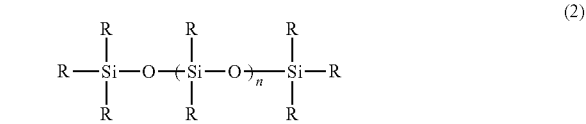

(2)

In the above general formula (2), at least one R among a plurality of R represents a hydrocarbon group having 1 to 40 carbon atoms and carboxyl group and the rest of R each represent hydrogen atom or a group selected from phenyl group and methyl group, the atoms and the groups repre- sented by a plurality of R may be the same with or different from each other, and n represents an average value, which is a positive number of 1 to 50.

It is preferable that the amount of component (f1) which can be used in the present invention is 0.01% by weight or more and 3% by weight or less in the entire epoxy resin composition. The fouling in the appearance of the molded article with the mold release or the organopolysiloxane in an excess amount can be suppressed, and the excellent continu- ous molding property can be obtained when the amount is the within the above range.

In the present invention, other organopolysiloxanes can be used in combination as long as the effect of addition of com- ponent (F) comprising (f1) an organopolysiloxane having carboxyl group and/or (f2) a reaction product of (f1) an orga- nopolysiloxane having carboxyl group with an epoxy resin is not adversely affected.

The epoxy resin composition of the present invention may further comprise various additives in combination with com- ponents (A) to (F). Examples of the additive include flame retardants such as brominated epoxy resins, antimony triox- ide, phosphorus compounds and metal hydroxides; coupling agents such as y-glycidoxypropyltrimethoxysilane; coloring agents such as carbon black and red oxide; natural waxes such as carnauba wax; synthetic waxes such as polyethylene wax; mold releases such as higher fatty acids and metal salts thereof, for example stearic acid and zinc stearate, and paraf- fin; and antioxidants such as bismuth oxide hydrate. Where necessary, the inorganic filler may be used after being sub- jected to a surface treatment with a coupling agent, an epoxy resin or a phenol resin in advance. Examples of the process of the surface treatment include the process of mixing with a solvent, followed by removal of the solvent and the process of adding directly to the inorganic filler, followed by treating by a mixer.

The epoxy resin composition of the present invention can be obtained by mixing components (A) to (F) and other addi- tives using a mixer or the like, followed by further mixing under heating by a heated kneader, heated rolls or an extruder, cooling and pulverizing the mixture.

For encapsulating electronic parts such as semiconductor elements using the epoxy resin composition of the present invention and preparing semiconductor devices, a conven- tional molding and curing process such as the transfer mold- ing process, the compression molding process and the injec- tion molding process can be conducted.

EXAMPLES

The present invention will be described more specifically with reference to examples in the following. However, the present invention is not limited to the examples.

Example 1

The following components were mixed, further mixed at 95° C. for 8 minutes using heated rolls, cooled and pulverized, and an epoxy resin composition was obtained. The obtained epoxy resin composition was evaluated in accordance with the methods also shown in the following.

| | |
|---|---|
| E-1: An epoxy resin expressed by formula (3) [manufactured by NIPPON KAYAKU Co., Ltd.; NC3000P; the softening point: 58° C.; the epoxy equivalent: 274] | 8.07 parts by weight |

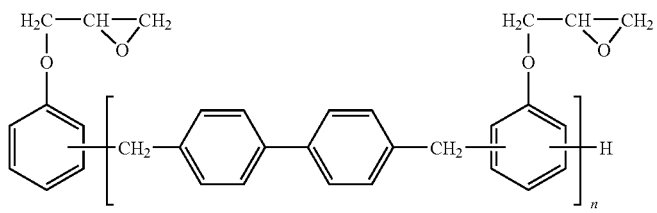

(3)

| | |
|---|---|
| H-1: A phenol resin expressed by formula (4) [manufactured by MEIWA KASEI Co., Ltd.; MEH-7851SS; the softening point: 107° C.; the hydroxyl equivalent: 203] | 8.07 parts by weight |

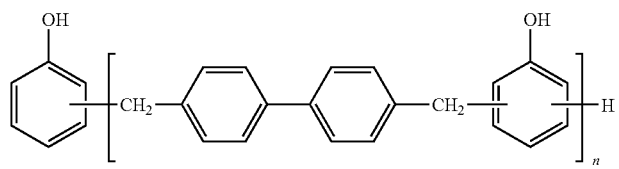

(4)

| | |
|---|---|
| 1,8-Diazabicyclo(5.4.0)undecene -7 (referred to as DBU, hereinafter) | 0.15 parts by weight |
| Fused spherical silica (the average particle diameter 21 μm) | 85.00 parts by weight |
| Butadiene-acrylonitrile copolymer 1 [manufactured by UBE KOSAN Co., Ltd.; HYCAR CTBN 1008-SP [a butadiene-acrylonitrile copolymer represented by general formula (1) wherein x = 0.82, y = 0.18, average value of z is 62, number average molecular weight is 3550, carboxyl equivalent is 2200 g/eq, content of sodium ion is 5 ppm, content of chlorine ion is 200 ppm, and contains 2,6-di-tert-butyl-4-methylphenol as a non-phosphor type antioxidant] | 0.20 parts by weight |
| Coupling agent (γ-glycidoxypropyltrimethoxysilane) | 0.20 parts by weight |
| Carbon black | 0.20 parts by weight |
| Carnauba wax | 0.20 parts by weight |

Methods of Evaluation

Spiral flow: Using a low pressure transfer molding machine, an epoxy resin composition was injected into a mold for the measurement of spiral flow in accordance with EMMI-1-66 under the condition of a mold temperature of 175° C., an injection pressure of 6.9 MPa and a curing time of 120 seconds, and the length of flow was measured. The unit was cm. The spiral flow was decided to be poor (failed) when the length was shorter than 100 cm, and to be good (passed) when the length was 100 cm or longer.

Continuous molding property: Using a low pressure automatic transfer molding machine, 700 shots of molding of 80pQFP (a Cu lead frame; the outer dimensions of the package: 14 mm×20 mm×2 mm thickness; the size of the pad: 6.5 mm×6.5 mm; the size of the chip: 6.0 mm×6.0 mm) were conducted under the condition of a mold temperature of 175° C., an injection pressure of 9.6 MPa and a curing time of 70 seconds. The molding property was decided to be excellent when the continuous molding of 700 shots could be conducted without problems such as insufficient filling; to be good when the continuous molding of 500 shots could be conducted without problems such as insufficient filling; and to be poor when insufficient filling took place before 500 shots were completed.

Appearance of a molded article and fouling on a mold: Fouling on the package and the mold used in the above after 500 shots and 700 shots of the continuous molding was examined by visual observation. The result was evaluated to be excellent when no fouling was found after 700 shots, to be good when no fouling was found after 500 shots, and to be poor when fouling was found before 500 shots were completed.

Deformation of a gold wire: Using a low pressure transfer molding machine, molding of 160pLQFP (PPF frame; the size of the package: 24 mm×24 mm×1.4 mm thickness; the size of the chip: 7.0 mm×7.0 mm; the thickness of the gold wire: 25 μm; the length of the gold wire: 3 mm) was conducted under the condition of a mold temperature of 175° C., an injection pressure of 9.3 MPa and a curing time of 120 seconds. The 160pQFP package obtained by the molding was examined by observation using a soft X-ray fluoroscopy apparatus, and the ratio: (the amount of flow)/(the length of the gold wire) was calculated and used as the deformation of a gold wire. The result was evaluated to be good when the deformation was 4% or smaller, and to be poor when the deformation exceeded 4%.

Resistance to soldering: The package obtained above by the molding in the evaluation of the continuous molding property was post-cured at 175° C. for 8 hours. After the humidifying treatment at 85° C. under a relative humidity of 85% for 168 hours, the package was dipped into a solder tank at 260° C. for 10 seconds. Then, the package was examined by observation using a microscope, and the fraction of crack formation was calculated as: [(the fraction of formation of cracks)=(the number of packages having external cracks)/(the number of the entire packages)×100. The unit was %. Ten packages were used for the examination. The adhesion at the interface of the semiconductor device and the cured product of the epoxy resin composition was examined by observation using an ultrasonic crack detector. Ten packages were used for the evaluation. The result was evaluated to be good when the fraction of crack formation was 0% and no cleavage was found and to be poor when a crack or a cleavage was found.

Examples 2 to 13 and Comparative Examples 1 to 3

Epoxy resin compositions were obtained in accordance with the formulations shown in Tables 1, 2 and 3 and in accordance with the same procedures as those conducted in Example 1 and evaluated in accordance with the same methods as those conducted in Example 1. The results are shown in Tables 1, 2 and 3. Raw materials other than those used in Example 1 are shown in the following.

E-2: An epoxy resin of the biphenyl type expressed by formula (5) [manufactured by JAPAN EPOXY RESIN Co., Ltd.; YX-4000; the epoxy equivalent 185 g/eq; the melting point: 105° C.]

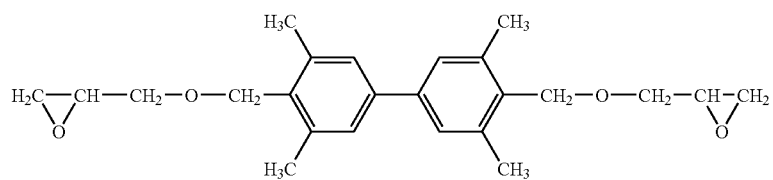

(5)

H-2: A phenol resin of the p-xylylene-modified novolak type which is expressed by formula (6) [manufactured by MITSUI KAGAKU Co., Ltd.; XCL-4L; the hydroxyl equivalent: 168 g/eq; the softening point: 62° C.]

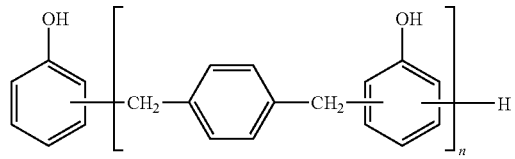

(6)

A melted reaction product A: An epoxy resin of the bisphenol A type [manufactured by JAPAN EPOXY RESIN Co., Ltd.; YL-6810; the epoxy equivalent 170 g/eq; the melting point: 47° C.] in an amount of 66.1 parts by weight was melted by heating at 140° C. Then, 33.1 parts by weight of butadiene-acrylonitrile copolymer 1 [manufactured by UBE KOSAN Co., Ltd.; HYCAR CTBN 1008-SP] and 0.8 parts by weight of triphenylphosphine were added. The resultant mixture was mixed by melting for 30 minutes, and melted reaction product A was obtained.

Butadiene-acrylonitrile copolymer 2: [a butadiene-acrylonitrile copolymer represented by formula (1) wherein x=0.82, y=0.18, average value of z is 62, number average molecular weight is 3550, carboxyl equivalent is 2200 g/eq, content of sodium ion is 5 ppm, content of chlorine ion is 200 ppm, and contains an organic phosphor type antioxidant Geltrol manufactured by AGIRITE]

Butadiene-acrylonitrilecopolymer 3: [a butadiene-acrylonitrile copolymer represented by formula (1) wherein x=0.82, y=0.18, average value of z is 62, number average molecular weight is 3550, carboxyl equivalent is 2200 g/eq, content of sodium ion is 500 ppm, content of chlorine ion is 1500 ppm, and contains 4,6-di-tert-butylphenol as a nonphosphor type antioxidant]

Butadiene-acrylonitrilecopolymer 4: [a butadiene-acrylonitrile copolymer represented by formula (1) wherein x=0.82, y=0.18, average value of z is 62, number average molecular weight is 3550, carboxyl equivalent is 2200 g/eq, content of sodium ion is 5 ppm, content of chlorine ion is 200 ppm, and contains no antioxidant]

Organopolysiloxane 1: An organopolysiloxane expressed by formula (7):

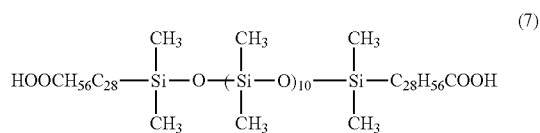

(7)

Organopolysiloxane 2: An organopolysiloxane expressed by formula (8):

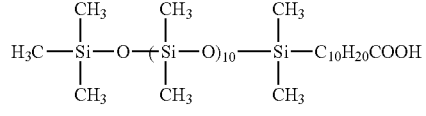

(8)

Organopolysiloxane 3: An organopolysiloxane expressed by formula (9):

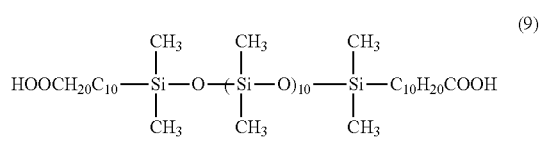

(9)

Organopolysiloxane 4: An organopolysiloxane expressed by formula (10):

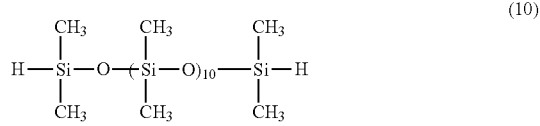

(10)

Melted reaction product B: An epoxy resin of the bisphenol A type [manufactured by JAPAN EPDXY RESIN Co., Ltd.; YL-6810; the epoxy equivalent 170 g/eq; the melting point:

47° C.] in an amount of 66.1 parts by weight was melted by heating at 140° C. Then, 33.1 parts by weight of organopolysiloxane 3 [the organopolysiloxane expressed by formula (9)] and 0.8 parts by weight of triphenylphosphine were added. The resultant mixture was mixed by melting for 30 minutes, and melted reaction product B was obtained.

TABLE 1

| | Example | | | | | | |
|---|---|---|---|---|---|---|---|
| | 1 | 2 | 3 | 4 | 5 | 6 | 7 |
| E-1 | 8.07 | 7.57 | 7.97 | | 7.79 | 9.50 | 7.97 |
| E-2 | | | | 4.65 | | | |
| H-1 | 5.98 | 6.08 | 5.88 | | 5.76 | 7.05 | 5.88 |
| H-2 | | | | 4.20 | | | |
| DBU | 0.15 | 0.15 | 0.15 | 0.15 | 0.15 | 0.15 | 0.15 |
| Spherical fused silica | 85.00 | 85.00 | 85.00 | 90.00 | 85.00 | 80.00 | 85.00 |
| Butadiene-acrylo-nitrile copolymer 1 | 0.20 | | 0.20 | 0.20 | 0.50 | 0.20 | 0.20 |
| Melted reaction product A | | 0.60 | | | | | |
| Organopolysiloxane 1 | | | 0.20 | 0.20 | 0.20 | 2.50 | |
| Organopolysiloxane 2 | | | | | | | 0.20 |
| Coupling agent | 0.20 | 0.20 | 0.20 | 0.20 | 0.20 | 0.20 | 0.20 |
| Carbon black | 0.20 | 0.20 | 0.20 | 0.20 | 0.20 | 0.20 | 0.20 |
| Carnauba wax | 0.20 | 0.20 | 0.20 | 0.20 | 0.20 | 0.20 | 0.20 |
| Spiral flow (cm) | 110 | 105 | 114 | 120 | 103 | 124 | 110 |
| Continuous molding | G | EX | EX | EX | EX | EX | EX |
| Appearance of molded | G | G | EX | EX | EX | EX | EX |
| Fouling on mold | G | G | EX | EX | EX | G | EX |
| Deformation of gold wire | G | G | G | | GG | | |
| Resistance to solder reflow | G | G | G | | GG | | |

Note:
In tables 1 to 3, EX means "excellent", G means "good" and P means "poor".

TABLE 2

| | Example | | | | | |
|---|---|---|---|---|---|---|
| | 8 | 9 | 10 | 11 | 12 | 13 |
| E-1 | 7.97 | 7.97 | 7.45 | 7.97 | 7.97 | 7.97 |
| H-1 | 5.88 | 5.88 | 6.00 | 5.88 | 5.88 | 5.88 |
| DBU | 0.15 | 0.15 | 0.15 | 0.15 | 0.15 | 0.15 |
| Spherical fused silica | 85.00 | 85.00 | 85.00 | 85.00 | 85.00 | 85.00 |
| Butadiene-acrylonitrile copolymer 1 | 0.20 | 0.20 | 0.20 | | | |
| Butadiene-acrylonitrile copolymer 2 | | | | 0.20 | | |
| Butadiene-acrylonitrile copolymer 3 | | | | | 0.20 | |
| Butadiene-acrylonitrile copolymer 4 | | | | | | 0.20 |
| Organopolysiloxane 1 | | | | 0.20 | 0.20 | 0.20 |
| Organopolysiloxane 3 | 0.20 | | | | | |
| Organopolysiloxane 4 | | 0.20 | | | | |
| Melted reaction product B | | | 0.60 | | | |
| Coupling agent | 0.20 | 0.20 | 0.20 | 0.20 | 0.20 | 0.20 |
| Carbon black | 0.20 | 0.20 | 0.20 | 0.20 | 0.20 | 0.20 |
| Carnauba wax | 0.20 | 0.20 | 0.20 | 0.20 | 0.20 | 0.20 |
| Spiral flow (cm) | 109 | 111 | 125 | 115 | 113 | 117 |
| Continuous molding property | EX | G | EX | EX | EX | EX |
| Appearance of molded article | EX | G | G | EX | EX | EX |
| Fouling on mold | EX | G | G | EX | EX | EX |
| Deformation of gold wire | G | G | G | G | G | G |
| Resistance to solder reflow | G | G | G | G | G | G |

TABLE 3

| Comparative Example | 1 | 2 | 3 |
|---|---|---|---|
| E-1 | 8.20 | 7.37 | 8.07 |
| H-1 | 6.05 | 5.48 | 5.98 |
| DBU | 0.15 | 0.15 | 0.15 |
| Spherical fused silica | 85.00 | 85.00 | 85.00 |
| Butadiene-acrylonitrile copolymer 1 | | 1.20 | |
| Organopolysiloxane 1 | | 0.20 | 0.20 |
| Coupling agent | 0.20 | 0.20 | 0.20. |
| Carbon black | 0.20 | 0.20 | 0.20 |
| Carnauba wax | 0.20 | 0.20 | 0.20 |
| Spiral flow (cm) | 123 | 92 | 118 |
| Continuous molding property | P | EX | G |
| Appearance of molded article | P | EX | G |
| Fouling on mold | P | EX | G |
| Deformation of gold wire | G | P | G |
| Resistance to solder reflow | P | G | P |

INDUSTRIAL APPLICABILITY

The epoxy resin composition of the present invention exhibits the excellent properties in that the moisture absorption and the stress are small. When semiconductor elements are encapsulated by molding using the composition, the releasing property from the mold and the continuous molding property are excellent, and the adhesion with a lead frame, in particular a plated copper lead frame (such as a silver-plated lead frame, a nickel-plated lead frame and a preplated frame having gold plating on a nickel/palladium alloy), is also excellent. The semiconductor device exhibiting excellent resistance to solder reflow can be obtained. Therefore, the epoxy resin composition can be advantageously used for semiconductor devices for which the surface mounting is conducted using a lead-free solder.

The invention claimed is:

1. A semiconductor device comprising a semiconductor element encapsulated by using an epoxy resin composition which comprises (A) an epoxy resin comprising at least one epoxy resin selected from the group consisting of (a1) a biphenyl epoxy resin and (a2) a phenol aralkyl epoxy resin having a skeleton structure of biphenylene, (B) a phenol resin comprising at least one phenol resin selected from the group consisting of (b1) a phenol aralkyl resin having a skeleton structure of phenylene and (b2) a phenol aralkyl resin having a skeleton structure of biphenylene, (C) a curing accelerator, (D) an inorganic filler, (E) at least one of (e1) a butadiene-acrylonitrile copolymer having carboxyl group and (e2) a reaction product of (e1) a butadiene-acrylonitrile copolymer having carboxyl group with an epoxy resin, wherein the component (e1) has a number average molecular weight of 2000 to less than 5000, a carboxyl equivalent of 1200 to less than 3000, and component (e1) is present in the entire epoxy resin composition in an amount of 0.01% by weight to 1% by weight and (F) at least one of (f1) an organopolysiloxane having a carboxyl group and (f2) a reaction product of (f1) an organopolysiloxane having a carboxyl group with an epoxy resin, wherein component (f1) is present in the entire epoxy resin composition in an amount of 0.01% by weight to 3% by weight.

2. The semiconductor device according to claim 1, wherein the epoxy resin (A) comprises (a1) a biphenyl epoxy resin and the phenol resin (B) comprises (b1) a phenol aralkyl resin having a skeleton structure of phenylene.

3. The semiconductor device according to claim 1, wherein the epoxy resin (A) comprises (a2) a phenol aralkyl epoxy resin having a skeleton structure of biphenylene and the phenol resin (B) comprises (b2) a phenol aralkyl resin having a skeleton structure of biphenylene.

4. The semiconductor device according to claim 1, wherein content of sodium ion in (e1) is 10 ppm or less and content of chlorine ion in (e1) is 450 ppm or less.

5. The semiconductor device according to claim 1, wherein the butadiene-acrylonitrile copolymer having carboxyl group (e1) is a compound represented by formula (1):

wherein Bu represents a butadiene unit, ACN represents an acrylonitrile unit, Bu and ACN may be arranged randomly or in blocks, x and y each represents a positive number less than 1, x+y=1, and z represents an integer of 50 to 80.

6. The semiconductor device according to claim 1, wherein the organopolysiloxane having carboxyl group is an organopolysiloxane represented by formula (2):

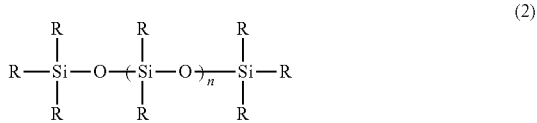

wherein at least one R represents an organic group having a carboxyl group, said organic group comprising 1 to 40 carbon atoms and rest of R each represent a hydrogen atom, a phenyl group or methyl group, the plurality of R groups may be the same or different, and n represents an average value, which is a positive number of 1 to 50.

7. The semiconductor device according to claim 5, wherein the epoxy resin (A) comprises (a2) a phenol aralkyl epoxy resin having a skeleton structure of biphenylene and the phenol resin (B) comprises (b2) a phenol aralkyl resin having a skeleton structure of biphenylene.

8. The semiconductor device according to claim 5, wherein the organopolysiloxane having carboxyl group is an organopolysiloxane represented by formula (2):

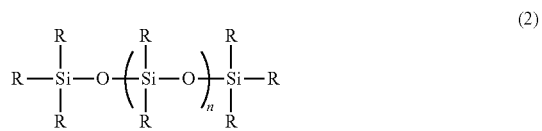

wherein at least one R represents an organic group having carboxyl group, said organic group comprising 1 to 40 carbon atoms and rest of R each represent a hydrogen atom, a phenyl group or methyl group, the plurality of R groups may be the same or different, and n represents an average value, which is a positive number of 1 to 50.

9. The semiconductor device according to claim 8, wherein the epoxy resin (A) comprises (a2) a phenol aralkyl epoxy resin having a skeleton structure of biphenylene and the phenol resin (B) comprises (b2) a phenol aralkyl resin having a skeleton structure of biphenylene.

10. The semiconductor device according to claim 9, wherein a content of sodium ion in (e1) is 10 ppm or less and content of chlorine ion in (e1) is 450 ppm or less.

* * * * *